United States Patent
Hiratani et al.

(10) Patent No.: US 10,062,633 B2
(45) Date of Patent: Aug. 28, 2018

(54) SUBSTRATE UNIT

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Shungo Hiratani, Mie (JP); Hideaki Tahara, Mie (JP); Kazuyoshi Ohara, Mie (JP); Munsoku O, Mie (JP); Hideo Morioka, Mie (JP); Arinobu Nakamura, Mie (JP)

(73) Assignees: AutoNetworks Technologies, Ltd., Yokkaichi-shi, Mie (JP); Sumitomo Wiring Systems, Ltd., Yokkaichi-shi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 15/549,243

(22) PCT Filed: Jan. 29, 2016

(86) PCT No.: PCT/JP2016/052575
§ 371 (c)(1),
(2) Date: Aug. 7, 2017

(87) PCT Pub. No.: WO2016/132852
PCT Pub. Date: Aug. 25, 2016

(65) Prior Publication Data
US 2018/0033714 A1   Feb. 1, 2018

(30) Foreign Application Priority Data
Feb. 19, 2015 (JP) .................. 2015-030795

(51) Int. Cl.
*H01L 23/50* (2006.01)
*H01L 23/367* (2006.01)
*H01L 25/07* (2006.01)

(52) U.S. Cl.
CPC .......... *H01L 23/3675* (2013.01); *H01L 23/50* (2013.01); *H01L 25/072* (2013.01)

(58) Field of Classification Search
CPC ..... H01L 23/50; H01L 25/053; H01L 25/072; H01L 23/15; H01L 23/053; H01L 23/16;
(Continued)

(56) References Cited

U.S. PATENT DOCUMENTS

| 2003/0137813 A1 | 7/2003 | Onizuka et al. |
| 2007/0086152 A1* | 4/2007 | Sasaki ................. B60R 16/0239 361/679.02 |

(Continued)

FOREIGN PATENT DOCUMENTS

| JP | 2003-164039 A | 6/2003 |
| JP | 2005-268648 A | 9/2005 |

(Continued)

OTHER PUBLICATIONS

Search Report for PCT/JP2016/052575, dated Apr. 19, 2016.

*Primary Examiner* — Chuong A Luu
(74) *Attorney, Agent, or Firm* — Honigman Miller Schwartz and Cohn LLP

(57) ABSTRACT

Provided is a substrate unit configured to improve heat dissipation efficiency while preventing workability from degrading at the time of assembly. A substrate unit includes: a substrate that has one surface on having a conductive pattern, and includes an opening; a conductive member that includes a main portion is fixed to the other surface of the substrate, and at least one terminal of an electronic component is electrically connected via the opening; and a heat (Continued)

dissipation member is fixed to a surface of the conductive member opposite a substrate side surface thereof, wherein the conductive member is provided with an extension portion that extends from the main portion of the conductive member and to which an external device is to be electrically connected, the extension portion intersecting a plane that extends along the heat dissipation member.

5 Claims, 10 Drawing Sheets

(58) Field of Classification Search
CPC ..... H01L 23/498; H01L 23/10; H01L 23/367; H01L 23/3675; H01L 25/07
USPC ......................................................... 257/691
See application file for complete search history.

(56) References Cited

U.S. PATENT DOCUMENTS

| | | |
|---|---|---|
| 2011/0005826 A1 | 1/2011 | Hashikura et al. |
| 2011/0141701 A1 | 6/2011 | Uejima et al. |

FOREIGN PATENT DOCUMENTS

| | | |
|---|---|---|
| JP | 2011-124488 A | 6/2011 |
| WO | 2009113631 A1 | 9/2009 |

\* cited by examiner

SUBSTRATE UNIT

CROSS-REFERENCE TO RELATED APPLICATIONS

This application is the U.S. national stage of PCT/JP2016/052575 filed Jan. 29, 2016, which claims priority of Japanese Patent Application No. JP 2015-030795 filed Feb. 19, 2015.

TECHNICAL FIELD

The present invention relates to a substrate unit that includes a substrate and a conductive member.

BACKGROUND

There are well-known substrate units in which a conductive member (also referred to as a bus bar, for example) that is part of a circuit that allows a relatively large current to pass therethrough is fixed to a substrate on which a conductive pattern that is part of a circuit that allows a relatively small current to pass therethrough is formed (for example, see JP2003-164039A below). Such a substrate unit includes a heat dissipation member that is fixed to one side of the conductive member (the side opposite the substrate side).

In order to improve heat dissipation efficiency, it is preferable that the heat dissipation member is located on the upper side. However, in conventional substrate units such as the substrate unit disclosed in the JP2003-164039A above, if the heat dissipation member is located on the upper side, a portion that electrically connects other electrical devices to the unit (the portion with number 54 in JP2003-164039A above) is located on the lower side, and a problem such as degradation in workability occurs at the time of assembly.

A problem to be solved by the present invention is to provide a substrate unit that is able to improve heat dissipation efficiency while preventing workability from degrading at the time of assembly.

SUMMARY

In order to solve the above-described problem, a substrate unit according to one aspect of the present invention includes: a substrate having an electronic component formed on one surface thereof, the substrate being provided with an opening; a conductive member that includes a main portion that is fixed to the other surface of the substrate, and to which at least one terminal of the electronic component is electrically connected via the opening that is provided in the substrate; and a heat dissipation member that is fixed to a surface of the conductive member that is opposite a substrate side surface thereof, wherein the conductive member is provided with an extension portion that extends from the main portion of the conductive member and to which an external device is electrically connectable, the extension portion intersecting a plane that extends along the heat dissipation member.

It is preferable that an insulating member is interposed between the extension portion of the conductive member and an end surface of the heat dissipation member.

It is preferable that the insulating member includes: a first portion that is located between the main portion of the conductive member and the heat dissipation member; and a second portion that is located between the extension portion of the conductive member and the end surface of the heat dissipation member.

It is preferable that the heat dissipation member is provided with a recessed portion into which the first portion of the insulating member is fitted.

It is preferable that the conductive member is provided with a recessed portion into which the first portion of the insulating member is fitted.

Advantageous Effects of Invention

In the substrate unit according to the aspect of the present invention, the extension portion to which an external device is electrically connectable and that extends from the main portion of the conductive member intersects the plane that extends along the heat dissipation member. Therefore, even if the heat dissipation member is located on the upper side of the entire unit, the top end side of the extension portion of the conductive member is located on the upper side of the entire unit. Therefore, it is possible to improve heat dissipation efficiency while preventing workability from degrading at the time of assembly.

If the extension portion that extends from the main portion of the conductive member intersects the plane that extends along the heat dissipation member, there is the risk of the conductive member and the heat dissipation member causing a short circuit. In contrast, if the insulating member is interposed between the extension portion and the end surface of the heat dissipation member, it is possible to prevent a short circuit from occurring (it is possible to place them with a distance that is sufficient for insulation therebetween (to secure an insulation distance)).

If the insulating member includes: the first portion that is located between the main portion of the conductive member and the heat dissipation member; and the second portion that is located between the extension portion of the conductive member and the end surface of the heat dissipation member, it is possible to further increase the above-described effect of preventing a short circuit from occurring.

With a configuration in which the heat dissipation member is provided with the recessed portion into which the first portion of the insulating member is fitted, it is possible to prevent the main portion of the conductive member from having a complex shape. With a configuration in which the conductive member is provided with the recessed portion into which the first portion of the insulating member is fitted, it is possible to prevent the heat dissipation member from having a complex shape.

DETAILED DESCRIPTION OF PREFERRED EMBODIMENTS

The following describes embodiments of the present invention in detail with reference to the drawings. Note that "height direction" (vertical direction) in the following description refers to a vertical direction shown in FIG. 5 unless otherwise specified. Although such a direction does not limit the orientation in which a substrate unit 1 is installed, the substrate unit 1 according to the present embodiment is basically disposed such that a heat dissipation member 40 is located on the upper side of the unit as described below.

Figure 1:
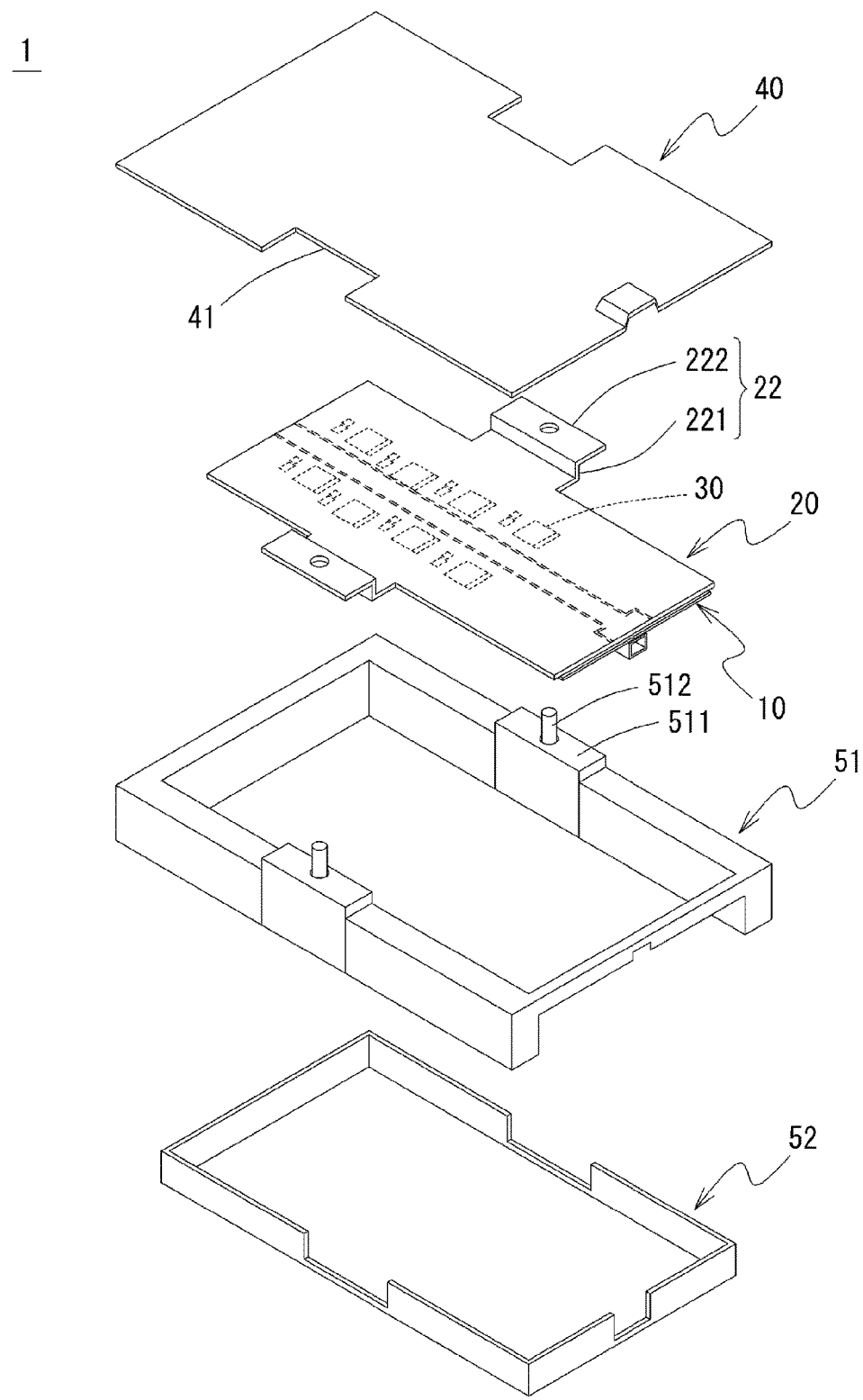
FIG. 1 is an exploded perspective view of a substrate unit according to an embodiment of the present invention.

The substrate unit 1 according to an embodiment of the present invention shown in FIG. 1 includes a substrate 10, a conductive member 20, electronic components 30, and a heat dissipation member 40. A conductive pattern is formed on one surface 10*a* (a lower surface) of the substrate 10. A conducting path that is constituted by the conductive pattern is a conducting path (part of the circuitry) for control signals, and a current flowing through this conducting path is relatively smaller than a current flowing through a conducting path (part of the circuitry) that is constituted by the conductive member 20.

The conductive member 20 includes: a main portion 21 that is fixed to another surface 10*b* (an upper surface) of the substrate 10; and an extension portion 22 that extends from the main portion 21. The conductive member 20 is formed in a predetermined shape through stamping or the like. The main portion 21 of the conductive member 20 constitutes a conducting path for power supply, which is a portion where a current that is relatively large (larger than a current flowing through the conducting path that is constituted by the conductive pattern) flows. Note that, although specific configurations of conducting paths are not described or illustrated, the main portion 21 of the conductive member 20 includes a plurality of portions that constitute conducting paths. The portions are independent of each other so as not to cause a short circuit, and are integrated into one piece by being fixed to the substrate 10. Before being fixed to the substrate 10, the plurality of portions are continuous via extra portions. After the plurality of portions have been fixed to the substrate 10, the extra portions are cut away, and thus each portion is brought into an independent state (a state in which each portion is not in direct contact with any other portions). The conductive member 20 (the main portion 21) is also referred to as a bus bar (a bus bar plate) or the like. The main portion 21 of the conductive member 20 is fixed to the other surface 10*b* of the substrate 10, using an insulative adhesive or adhesive sheet, for example. Thus, a set consisting of the substrate 10 and the conductive member 20 as shown in FIG. 2, into which the substrate 10 and the conductive member 20 are integrated, can be obtained.

Figure 2:
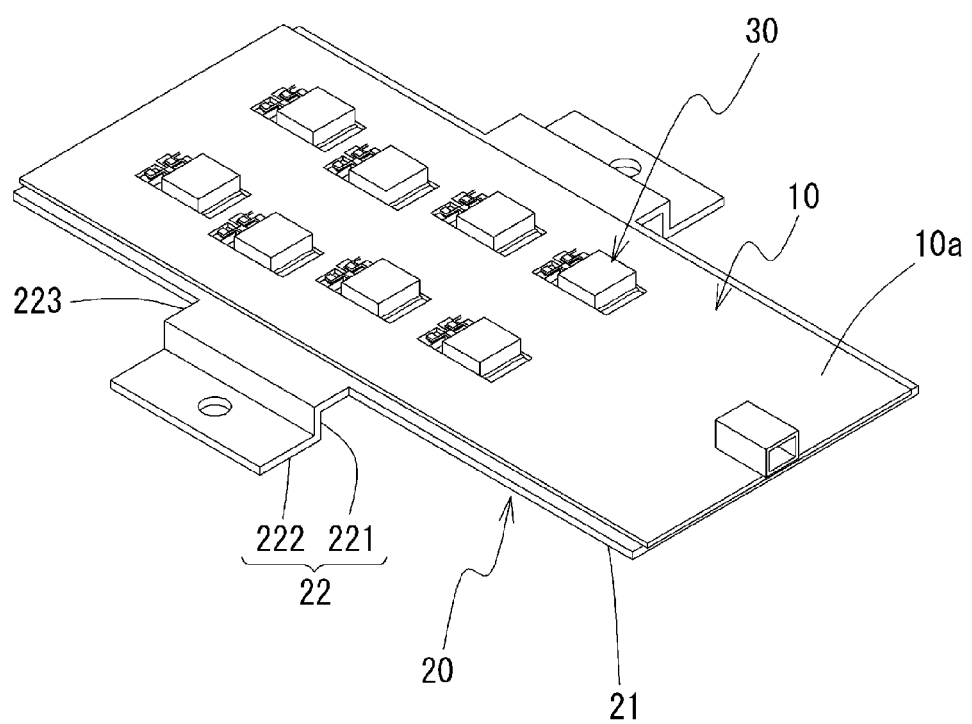
FIG. 2 is an external view (an external view from below) of a set consisting of a substrate and a conductive member.
Figure 5:
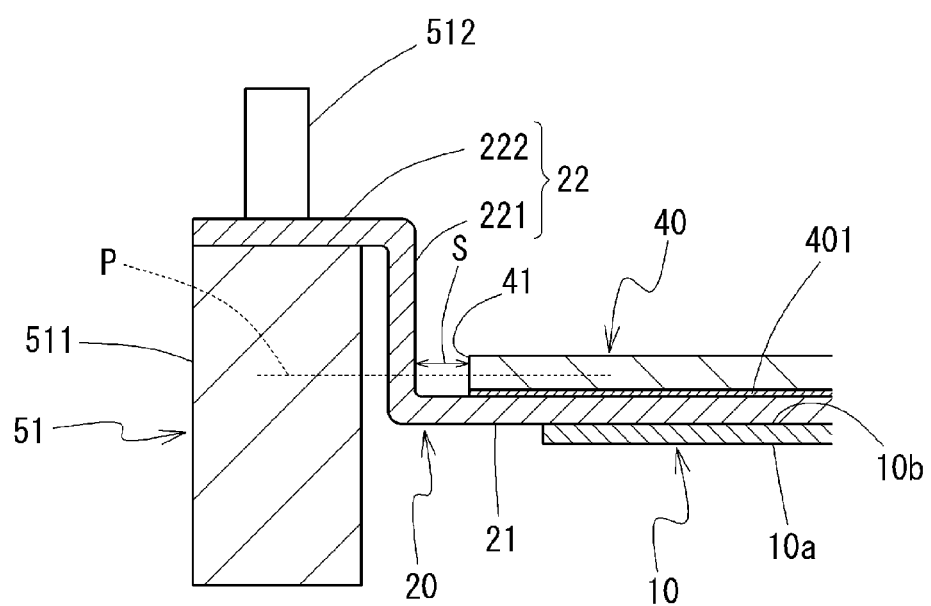
FIG. 5 schematically shows a cross section of the substrate unit shown in FIG. 1 (a second casing member is omitted).

The extension portion 22 of the conductive member 20 is bent relative to the main portion 21 (see FIGS. 1, 2, and 5, for example). The extension portion 22 according to the present embodiment includes: a portion (a base end portion 221) that extends upward from the main portion 21; and a portion (a top end portion 222) that bends from a top end (an upper end) of the base end portion 211 and extends in a direction that is parallel with the main portion 21. Note that the portion excluding the base end portion 221 and the top end portion 222 is the main portion 21. In other words, the portion indicated by 223 in FIG. 2 is a portion of the main portion 21. Furthermore, note that all of the portions that are located at the same position with respect to the vertical direction as a portion that is fixed to the other surface 10*b* of the substrate 10 are included in the main portion 21.

The conductive member 20 according to the present embodiment includes a plurality of extension portions 22. Each extension portion 22 is integrated into one piece with one of the above-described independent portions of the main portion 21. According to the present embodiment, one independent portion and one extension portion 22 are joined to each other. The top end portion 222 of each extension portion 22 serves as a portion (an input terminal portion or an output terminal portion) to which an external device is to be connected.

Figure 3:
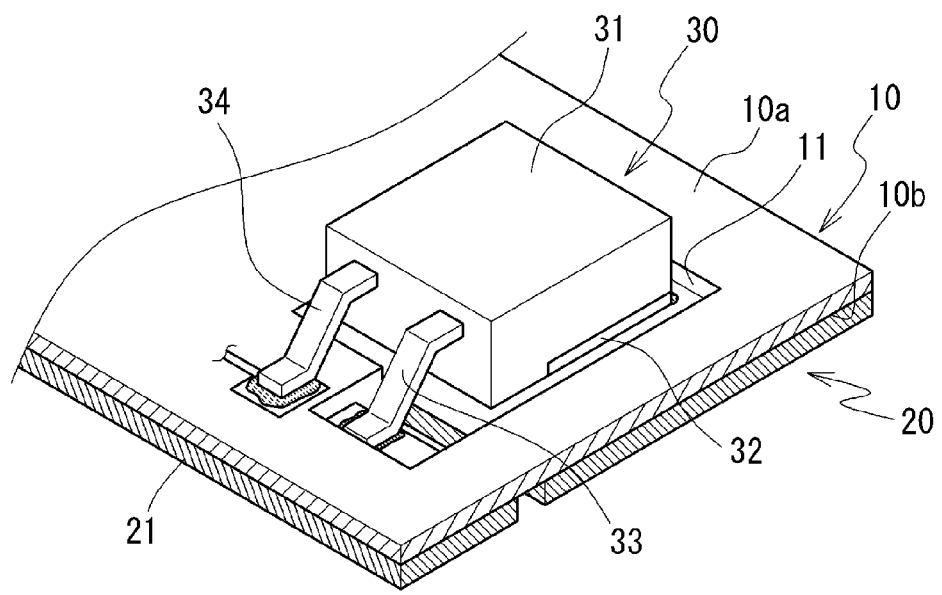
FIG. 3 schematically shows a portion of the set consisting of the substrate and the conductive member, where an electronic component (that has at least one terminal that is electrically connected to the conductive member) is mounted.
Figure 4:
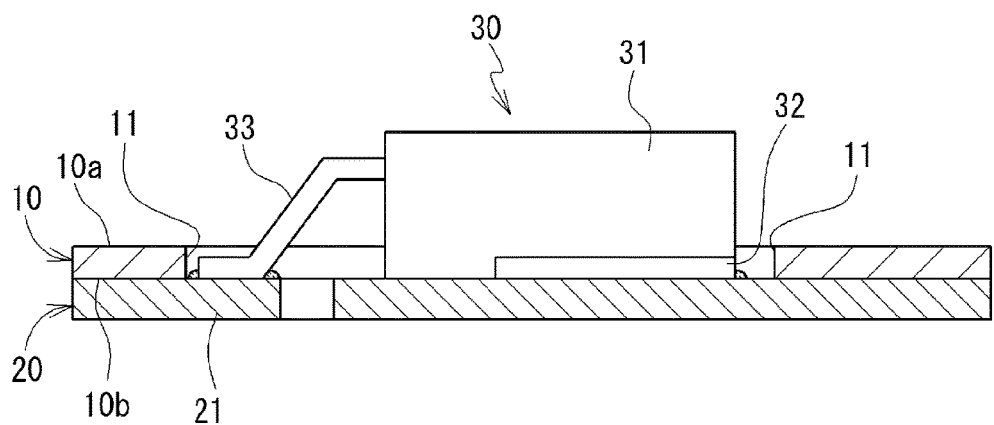
FIG. 4 is a cross-sectional view showing a portion of the set consisting of the substrate and the conductive member, where an electronic component (that has at least one terminal that is electrically connected to the conductive member) is mounted, and schematically showing a cross-section along a plane that passes through a drain terminal and a source terminal.

The electronic components 30 are devices that are mounted on the set consisting of the substrate 10 and the conductive member 20, and include a device body 31 and a terminal portion. A plurality of electronic components 30 are mounted on the set consisting of the substrate 10 and the conductive member 20. At least one of the terminals of a particular electronic component 30 are electrically connected to the main portion 21 of the conductive member 20 via an opening 11 that is formed in the substrate 10. A transistor (an FET) is an example of an electric component that has at least one terminal that is electrically connected to the main portion 21 of the conductive member 20. As shown in FIGS. 3 and 4, a drain terminal 32 and a source terminal 33 of the transistor are connected to the main portion 21 of the conductive member 20 via the opening 11 that is formed in the substrate 10, and a gate terminal 34 of the same is connected to the conductive pattern on the substrate 10. In this way, at least one terminal of the electronic component 30 that is mounted on the set consisting of the substrate 10 and the conductive member 20 is electrically connected directly to the conductive member 20. From another point of view, it is possible that there is an electronic component 30 all terminals of which are electrically connected directly to the conductive pattern that is formed on the substrate 10 (it is possible that there is an electronic component that has at least one terminal that is not electrically connected directly to the conductive member 20).

The heat dissipation member 40 is a member that is formed using a material with a high thermal conductivity (such as copper (a copper alloy)), and is fixed to the upper side of the main portion 21 of the conductive member 20 (the side that is opposite the substrate 10 side). The heat dissipation member 40 according to the present embodiment is formed using a conductive material, and therefore the main portion 21 of the conductive member 20 and the heat dissipation member 40 are insulated from each other. Specifically, the main portion 21 of the conductive member 20 and the heat dissipation member 40 are joined to each other via an insulative material 401 with a high thermal conductivity. The shape and so on of the heat dissipation member 40 may be modified as appropriate. In order to improve heat dissipation efficiency, it is also possible to provide fins or the like on the upper side of the heat dissipation member 40.

According to the present embodiment, the extension portions 22 of the conductive member 20 each intersect a plane P that extends along the heat dissipation member 40 (a plane that extends straight and outward from the heat dissipation member 40). The plane P that extends along the heat dissipation member 40 refers to a plane that passes through a middle portion (an intermediate portion between the upper end and the lower end) of the heat dissipation member 40 in the vertical direction, regardless of whether or not the heat dissipation member 40 has a flat plate-like shape. According to the present embodiment, the base end portions 221 of the extension portions 22, which extend in the vertical direction, are substantially orthogonal to the plane P that extends along the heat dissipation member 40. The base end portions 221 of the extension portions 22 according to the present embodiment pass through areas that are outside the outer edges of the heat dissipation member 40. As shown in FIG. 5, if there are sufficient gaps S between the extension portions 22 (the base end portions 221) and end surfaces of the heat dissipation member 40, insulation between the extension portions 22 (the conductive member 20) and the heat dissipation member 40 is secured.

Note that, as shown in FIG. 1, the heat dissipation member 40 according to the present embodiment has a shape in which central portions of its two side edges that face each other are recessed inward (the recessed portions are referred to as cutout portions 41). The edges of the cutout portions 41 also serve as portions of the outer edges of the heat dissipation member 40. The base end portions 221 of the extension portions 22 pass through areas that are inside the cutout portions 41 (the recessed portions). This configuration realizes a compact unit. In this case, it is preferable that there are sufficient gaps S between: the edges of the cutout portions 41, which are portions of the outer edges of the heat dissipation member 40; and the extension portions 22 (the base end portions 221). However, it is possible that a configuration in which such cutout portions 41 are not formed is employed. For example, it is possible that the heat dissipation member 40 has a rectangular shape, and the extension portions 22 (the base end portions 221) are located outside the outer edges of the heat dissipation member 40 that has the rectangular shape. In any case, it is necessary to secure a sufficient distance between the extension portions 22 (the base end portions 221) and the portions of the outer edges of the heat dissipation member 40 that are closest to the extension portions 22 (the base end portions 221).

The substrate unit 1 according to the present embodiment includes an external device connection portion. The external device connection portion can be provided in a first casing member 51 (a casing main portion). The first casing member 51 according to the present embodiment is a frame member that has a rectangular shape, and the substrate and the main portion 21 of the conductive member 20 can be located inside the first casing member 51. The external device connection portion according to the present embodiment includes base portions 511 that are portions of the "frame" of the first casing member 51, and male screw portions 512 that protrude upward from the upper surfaces of the base portions 511 (see FIGS. 1 and 5, for example). Through holes that allow the male screw portions 512 to pass therethrough are formed in the top end portions 222 that are bent from the base end portions 221 and extend in parallel with the main portion 21. The external device connection portion is aligned with terminals or the like that are to be electrically connected to an external device, and the conductive member 20 is fastened (joined) to the terminals or the like using a nut or the like, and thereby electrically connecting the conductive member 20 to the external device. The configuration of the external device connection portion may be modified as appropriate as long as the configuration allows the conductive member 20 to be electrically connected to an external device.

The substrate unit 1 according to the present embodiment also includes a second casing member 52 that covers the one surface 10a (the surface on which the conductive pattern is formed) of the substrate. At least a portion of the second casing member 52 is fitted into the first casing member 51, and the second casing member 52 covers the one surface 10a of the substrate.

In the substrate unit 1 according to the present embodiment, an upper wall of the casing that covers the set consisting of the substrate and the conductive member 20 is constituted by the heat dissipation member 40, a lower wall of the same is constituted by the second casing member 52, and side walls of the same are constituted by the first casing member 51 and the second casing member 52. In other words, at least a portion of the heat dissipation member 40 is exposed from the upper side of the unit. If the heat dissipation member 40 is located on the upper side of the unit in this way, it is possible to improve the efficiency of the dissipation of heat generated by the set consisting of the substrate and the conductive member 20.

The substrate unit 1 according to the present embodiment is not simply configured such that the heat dissipation member 40 is located on the upper side of the unit, but is configured such that the extension portions 22 that are portions to which an external device is to be electrically connected and that extend from the main portion 21 of the conductive member 20 intersect the plane P that extends along the heat dissipation member 40. In other words, the top end portions 222 of the extension portions 22, which are terminal portions for electrically connecting to the external device, are located at positions that are higher than the points (lines) where the extension portions 22 (the base end portions 221) and the plane P that extends along the heat dissipation member 40 intersect each other. To put it more simply, the top end portions 222 of the extension portions 22 are located at positions that are higher than the plane P that extends along the heat dissipation member 40.

Figure 9:
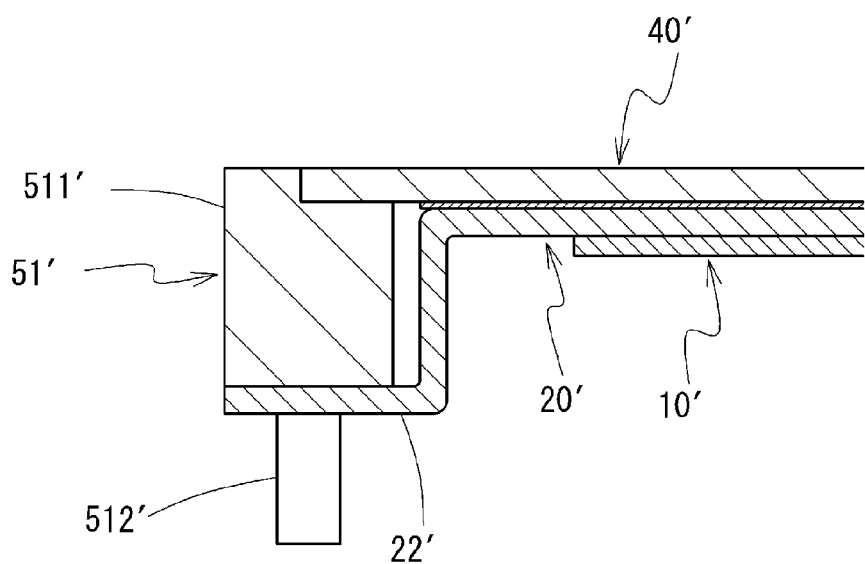
FIG. 9 schematically shows a cross section of a substrate unit according to a first reference example.
Figure 10:
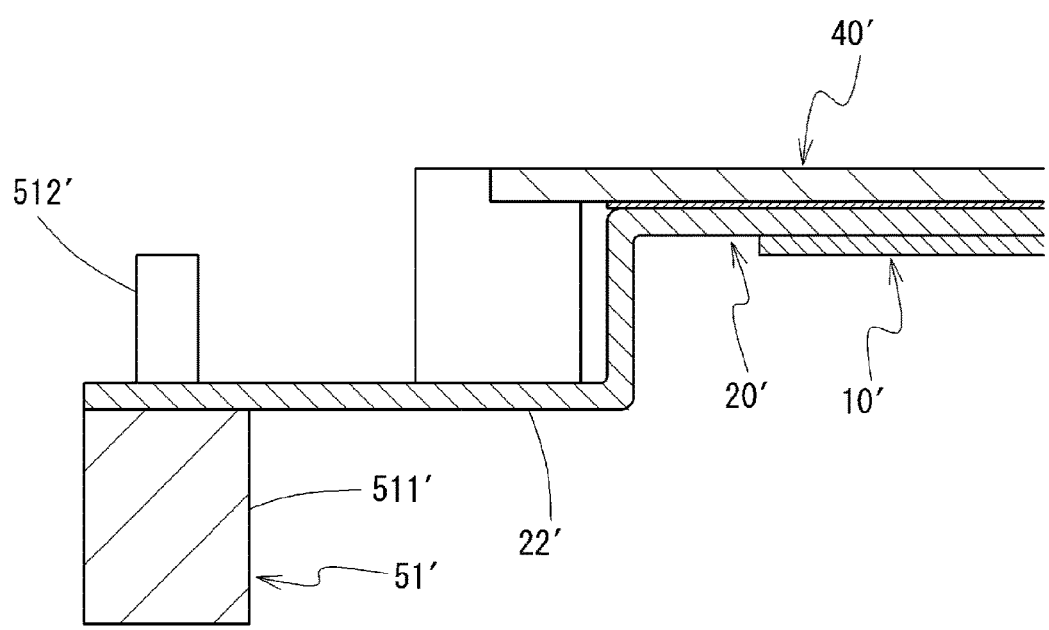
FIG. 10 schematically shows a cross section of a substrate unit according to a second reference example.

For example, in order to simply place the heat dissipation member on the upper side of the unit, it is possible to employ the configurations shown in FIG. 9 (a first reference example) and FIG. 10 (a second reference example), which are different from the substrate unit 1 according to the present embodiment. However, in the configuration shown in FIG. 9 (a configuration in which a conventional substrate unit is placed upside down), although a heat dissipation member 40' is located on the upper side, an external device connection portion, constructed in a first casing member 51', to which an external device is to be electrically connected, faces downward of the unit (specifically, male screw portions 512' protrude downward from the lower surface of base portions 511'), and therefore, there is the problem that it is difficult to connect the extension portions 22' of a set consisting of a substrate 10' and a conductive member 20' to an external device connection portion.

Also, in the configuration shown in FIG. 10, although the heat dissipation member 40' is located on the upper side and the external device connection portion (the base portions 511' and the male screw portions 512') faces upward, the external device connection portion is located outside the set consisting of the substrate 10' and the conductive member 20' (a main portion of the set consisting of the substrate 10' and the conductive member 20'), and therefore, considering workability when connecting the extension portions 22' of the set consisting of the substrate 10' and the conductive member 20' to the external device connection portion (to prevent a wrench or the like from interfering with the set consisting of the substrate 10' and the conductive member 20'), it is necessary to increase the distance between the external device connection portion and the set consisting of the substrate 10' and the conductive member 20' in a direction in which a surface of the substrate 10' extends. From another point of view, the extension portions 22' need to be long. Therefore, there is a problem in which the unit is large in a direction in which a surface of the substrate 10' extends.

In contrast, if the extension portions 22 of the conductive member 20 intersect the plane P that extends along the heat dissipation member 40 as in the substrate unit 1 according to the present embodiment, it is not only possible to increase heat dissipation efficiency due to the heat dissipation member 40 being provided on the upper side, but it is also possible to prevent workability from degrading and the size of the unit from increasing.

The following describes modifications of the substrate unit 1. A substrate unit 1a according to a first modification shown in FIGS. 6 and 7 and a substrate unit 1b according to a second modification shown in FIG. 8 are configured such that an insulating member 60 that is made of an insulative material 401 is interposed between extension portions 22 of the conductive member 20 and end surfaces of the heat dissipation member 40. Note that, in FIGS. 6 to 8, the components that are the same as those in the substrate unit 1 are assigned the same reference numerals.

If the gaps S between the extension portions 22 and the heat dissipation member 40 shown in FIG. 5 are sufficiently large (if an insulation distance is secured), a problem in an electrical sense does not occur. However, in order to miniaturize the unit, for example, if it is desired that the distance between the extension portions 22 and the heat dissipation member 40 is smaller, the insulating member 60 can be interposed therebetween.

In a cross-sectional view, the insulating member 60 includes: first portions 61 that are located between the main portion 21 of the conductive member 20 and the lower surface of the heat dissipation member 40; and second portions 62 that are located between the extension portions 22 of the conductive member 20 and end surfaces of the heat dissipation member 40. The first portions 61 are parallel with the substrate 10 (the main portion 21 of the conductive member 20), and the second portions 62 extend in the vertical direction. Therefore, the insulating member 60 substantially has the shape of an "L" in cross-sectional view. Due to the presence of the second portions 62 that are located between the extension portions 22 of the conductive member 20 and the end surfaces of the heat dissipation member 40, electrical insulation between the conductive member 20 and the heat dissipation member 40 can be secured. If end portions (upper ends) of the first portions 61 of the insulating member 60 are located at positions that are higher than the upper surface of the heat dissipation member 40, it is possible to ensure insulation between the conductive member 20 and the heat dissipation member 40.

Figure 6:
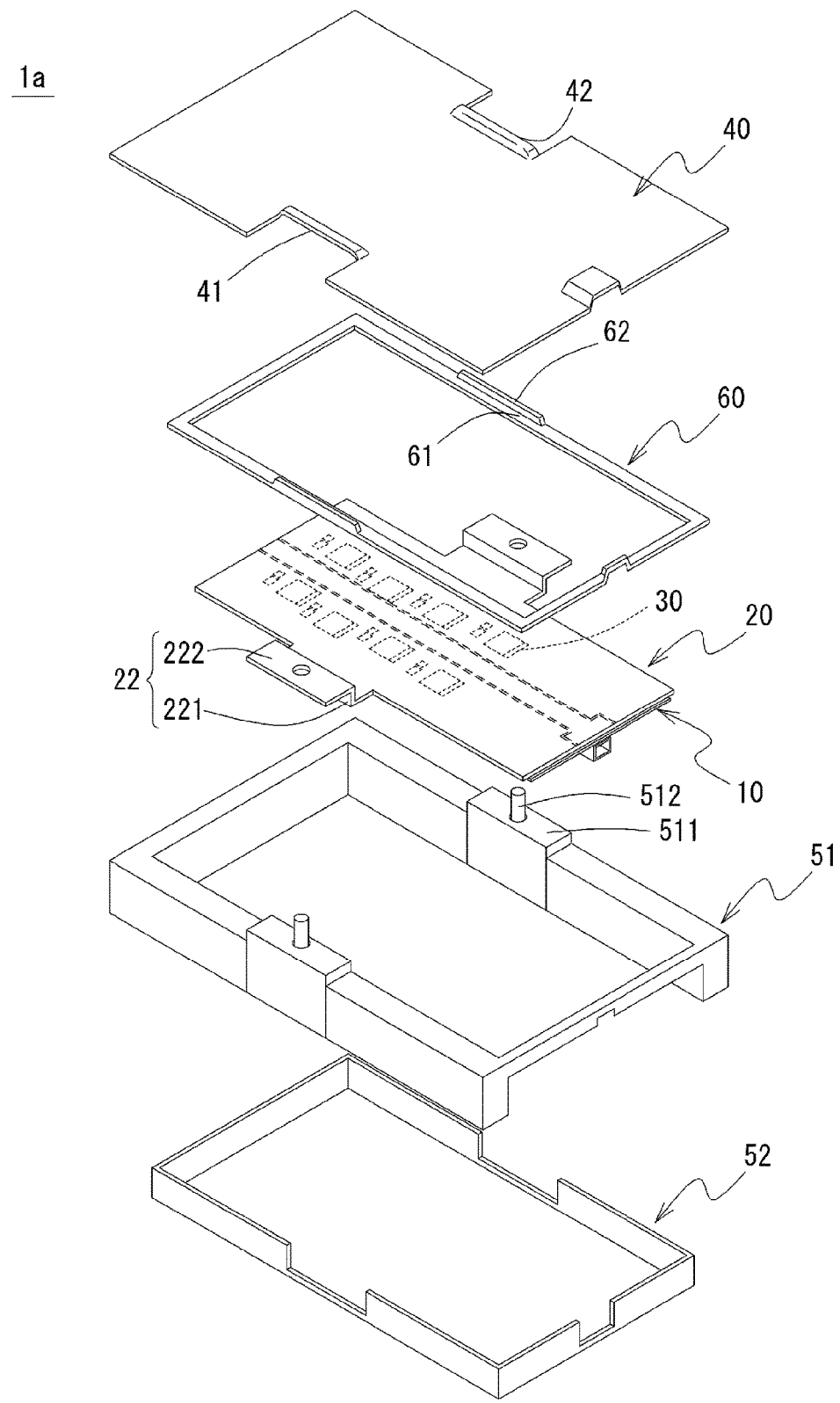
FIG. 6 is an exploded perspective view of a substrate unit according to a first modification.
Figure 7:
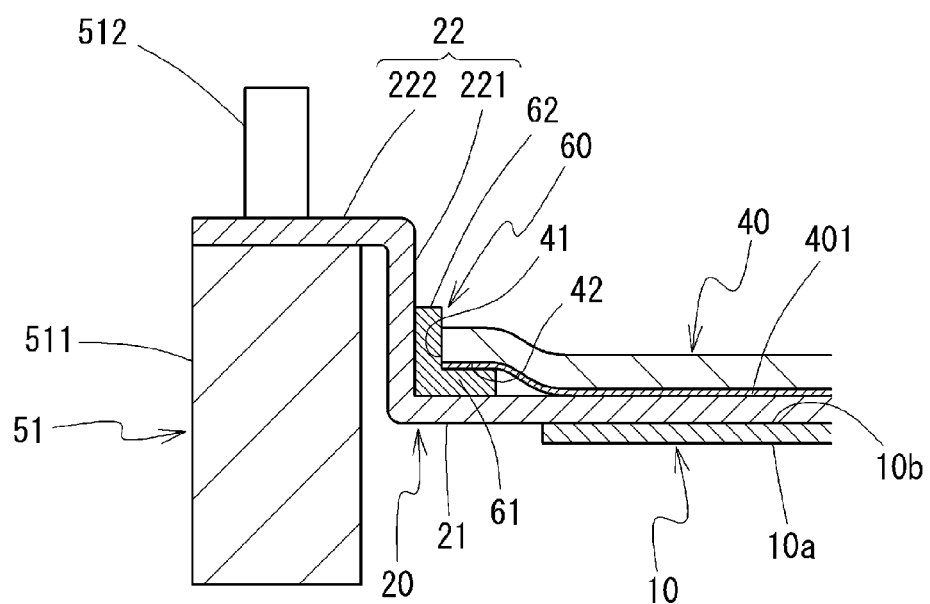
FIG. 7 schematically shows a cross section of the substrate unit shown in FIG. 6 (the second casing member is omitted).
Figure 8:
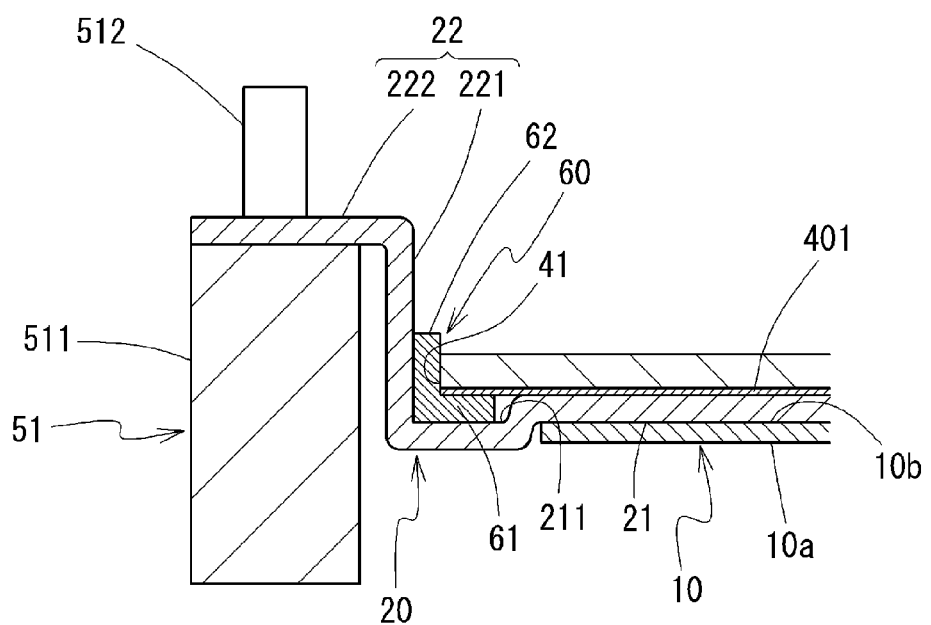
FIG. 8 schematically shows a cross section of a substrate unit according to a second modification (the second casing member is omitted).

The substrate unit 1a according to the first modification shown in FIGS. 6 and 7 is provided with recessed portions 42 into which the first portions 61 of the insulating member 60 of the heat dissipation member 40 can fit. The recessed portions 42 are formed along at least portions of the outer edge of the heat dissipation member 40. Specifically, the heat dissipation member 40 is formed such that outer edge side portions are located at positions that are higher than the remaining portion in the vertical direction. The recessed portions 42 are set such that the length thereof in the vertical direction (the depth) is substantially the same as that of the first portions 61 of the insulating member 60. More specifically, the lower surfaces of the first portions 61 of the insulating member 60 and the lower surface of a portion of the heat dissipation member 40 where the recessed portions 42 are not formed are located at substantially the same position in the vertical direction (flush with each other). The lower surfaces of the first portions 61 of the insulating member 60 and the lower surface of a portion of the heat dissipation member 40 where the recessed portions 42 are not formed are portions that are to be brought into intimate contact with the main portion 21 of the conductive member 20. Therefore, if these surfaces are flush with each other and the thickness of the insulative material 401 is negligible, then it is possible to bring these surfaces into intimate contact with the main portion 21 of the conductive member 20 that has a flat shape. In other words, the gaps between the first portions 61 of the insulating member 60 and the conductive member 20 and the gaps between the first portions 61 of the insulating member 60 and the heat dissipation member 40 can be reduced (the gaps can be eliminated), and therefore it is possible to prevent the insulating member 60 from moving.

As with the substrate unit 1a according to this first modification, with a configuration in which the heat dissipation member 40 is provided with the recessed portions 42 into which the first portions 61 of the insulating member 60 can fit, it is possible to prevent the main portion 21 of the conductive member 20 from having a complex shape. For example, as in the present embodiment, the main portion 21 of the conductive member 20 can have a flat shape.

On the other hand, in the substrate unit 1b according to the second modification shown in FIG. 8, the main portion 21 of the conductive member 20 is provided with recessed portions 211 into which the first portions 61 of the insulating member 60 can fit. The recessed portions 211 are formed along at least portions of the outer edge of the conductive member 20. Specifically, the main portion 21 of the conductive member 20 is formed such that outer edge side portions are located at positions that are lower than the remaining portion in the vertical direction. The extension portions 22 are located outside the portions of the conductive member 20 where the recessed portions 211 are formed. The recessed portions 211 are set such that the length thereof in the vertical direction (the depth) is substantially the same as that of the first portions 61 of the insulating member 60. More specifically, the upper surfaces of the first portions 61 of the insulating member 60 and the upper surfaces of a portion of the main portion 21 of the conductive member 20 where the recessed portions 211 are not formed are located at substantially the same position in the vertical direction (flush with each other). The upper surfaces of the first portions 61 of the insulating member 60 and the upper surface of a portion of the heat dissipation member 40 where the recessed portions 211 are not formed are portions that are to be brought into intimate contact with the main portion 21 of the conductive member 20. Therefore, if these surfaces are flush with each other and the thickness of the insulative material 401 is negligible, then it is possible to bring these surfaces into intimate contact with the main portion 21 of the conductive member 20 that has a flat shape. In other words, the gaps between the first portions 61 of the insulating member 60 and the conductive member 20 and the gaps between the first portions 61 of the insulating member 60 and the heat dissipation member 40 can be reduced (the gaps can be eliminated), and therefore it is possible to prevent the insulating member 60 from moving.

As with the substrate unit 1b according to this second modification, with a configuration in which the main portion 21 of the conductive member 20 is provided with the recessed portions 211 into which the first portions 61 of the insulating member 60 can fit, it is possible to prevent the heat dissipation member 40 from having a complex shape. For example, as in the present embodiment, the heat dissipation member 40 can have a flat shape. Note that "the heat dissipation member 40 is flat" means that a portion of the heat dissipation member 40 where is to be brought into intimate contact with the main portion 21 of the conductive member 20 is flat. For example, if the heat dissipation member 40 is provided with fins or the like for improving heat dissipation efficiency, it means that the shape of a portion excluding the fins or the like is flat.

In other words, if a configuration in which the insulating member 60 that is made of the insulative material 401 is interposed between the extension portions 22 of the conductive member 20 and the end surfaces of the heat dissipation member 40 in order to secure a reliable insulation state, and if it is desired that the main portion 21 of the conductive member 20 has a flat shape, the recessed portions 42, into which the first portions 61 of the insulating member 60 can fit, are formed in the heat dissipation member 40. If it is desired that the heat dissipation member 40 has a flat shape, the recessed portions 211, into which the first portions 61 of the insulating member 60 can fit, are formed in the main portion 21 of the conductive member 20.

Although embodiments of the present invention have been described above in detail, the present invention is not limited to the above-described embodiments in any manner, and may be various modified within the spirit of the present invention.

The invention claimed is:

1. A substrate unit comprising:
    a substrate having a conductive pattern formed on one surface thereof, the substrate being provided with an opening;
    a conductive member that includes a main portion that is fixed to the other surface of the substrate, and to which at least one terminal of an electronic component is electrically connected via the opening that is provided in the substrate; and
    a heat dissipation member that is fixed to a surface of the conductive member that is opposite a substrate side surface thereof, the heat dissipation member having a cutout forming a recess along a side edge of the heat dissipation member,
    wherein the conductive member is provided with an extension portion that extends from the main portion of the conductive member and to which an external device is electrically connectable, the extension portion extending into the cutout of the heat dissipation member and intersecting a plane that extends along the heat dissipation member.

2. The substrate unit according to claim 1, wherein an insulating member is interposed between the extension portion of the conductive member and an end surface of the heat dissipation member.

3. The substrate unit according to claim 2,
    wherein the insulating member includes:
    a first portion that is located between the main portion of the conductive member and the heat dissipation member; and
    a second portion that is located between the extension portion of the conductive member and the end surface of the heat dissipation member.

4. The substrate unit according to claim 3,
    wherein the heat dissipation member is provided with a recessed portion into which the first portion of the insulating member is fitted.

5. The substrate unit according to claim 3,
    wherein the conductive member is provided with a recessed portion into which the first portion of the insulating member is fitted.

* * * * *